US008587067B2

(12) United States Patent
Chang et al.

(10) Patent No.: US 8,587,067 B2
(45) Date of Patent: Nov. 19, 2013

(54) GRAPHENE DEVICES AND SILICON FIELD EFFECT TRANSISTORS IN 3D HYBRID INTEGRATED CIRCUITS

(75) Inventors: Josephine B. Chang, Mahopac, NY (US); Wilfried E. Haensch, Somers, NY (US); Fei Liu, Mt. Kisco, NY (US); Zihong Liu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/559,941

(22) Filed: Jul. 27, 2012

(65) Prior Publication Data

US 2012/0292702 A1 Nov. 22, 2012

Related U.S. Application Data

(62) Division of application No. 13/009,280, filed on Jan. 19, 2011, now Pat. No. 8,409,957.

(51) Int. Cl.
*H01L 27/088* (2006.01)

(52) U.S. Cl.
USPC ................................ 257/347; 257/E27.06

(58) Field of Classification Search
USPC ........................................... 257/347, E27.06
See application file for complete search history.

(56) References Cited

U.S. PATENT DOCUMENTS

| 6,064,082 | A | 5/2000 | Kawai et al. |
| 7,247,877 | B2 | 7/2007 | Hakey et al. |
| 7,619,257 | B2 | 11/2009 | Pfeiffer |
| 2009/0114903 | A1 | 5/2009 | Kalburge |
| 2009/0302394 | A1 | 12/2009 | Fujita |
| 2010/0051960 | A1 | 3/2010 | Chen et al. |
| 2010/0055388 | A1 | 3/2010 | Chen et al. |
| 2010/0200839 | A1 | 8/2010 | Okai et al. |
| 2011/0042687 | A1 | 2/2011 | Chu et al. |
| 2011/0059599 | A1 | 3/2011 | Ward et al. |
| 2011/0215300 | A1 | 9/2011 | Guo et al. |
| 2011/0284818 | A1 | 11/2011 | Avouris et al. |

OTHER PUBLICATIONS

F. Schwierz, "Graphene Transistors," Nature Nanotechnology, vol. 5, Jul. 2010, Review Article Published Online May 30, 2010, Copyright 2010 Macmillan Publishers Limited, pp. 487-496.
H. Lin et al., "A Compact Single-Walled Carbon Nanotube Transistor Integrated with a Silicon MOSFET Using a Single Common Gate," Mater. Res. Soc.-Symp. Proc. vol. 963, Copyright 2007 Materials Research Society, 0963-Q14-04.
J. Baliga, "Chips Go Vertical," IEEE Spectrum, Mar. 2004, NA, pp. 43-47, downloaded May 17, 2010 from IEEE Xplore.

(Continued)

*Primary Examiner* — Alexander Ghyka
*Assistant Examiner* — Stanetta Isaac
(74) *Attorney, Agent, or Firm* — Cantor Colburn LLP; Vazken Alexanian

(57) ABSTRACT

A three dimensional integrated circuit includes a silicon substrate, a first source region disposed on the substrate, a first drain region disposed on the substrate, a first gate stack portion disposed on the substrate, a first dielectric layer disposed on the first source region, the first drain region, the first gate stack portion, and the substrate, a second dielectric layer formed on the first dielectric layer, a second source region disposed on the second dielectric layer, a second drain region disposed on the second dielectric layer, and a second gate stack portion disposed on the second dielectric layer, the second gate stack portion including a graphene layer.

16 Claims, 14 Drawing Sheets

(56) References Cited

OTHER PUBLICATIONS

Office Action—Non-Final for U.S. Appl. No. 13/009,280, filed Jan. 19, 2011; First Named Inventor: Josephine B. Chang; Mailing Date: Jul. 13, 2012.

Office Action—Restriction/Election for U.S. Appl. No. 13/009,280, filed Jan. 19, 2011; First Named Inventor: Josephine B. Chang; Mailing Date; Mar. 21, 2012.

T. Cohen-Karni et al., Graphene and Nanowire Transistors for Cellular Interfaces and Electrical Recording, Nano Lett. 2010, Copyright 2010 American Chemical Society, Published on Web: Feb. 5, 2010, pp. 1098-1102.

US 8,587,067 B2

GRAPHENE DEVICES AND SILICON FIELD EFFECT TRANSISTORS IN 3D HYBRID INTEGRATED CIRCUITS

CROSS-REFERENCE TO RELATED APPLICATIONS

This is a divisional application of application Ser. No. 13/009,280, filed Jan. 19, 2011, which is incorporated by reference herein.

FIELD OF INVENTION

The present invention relates to hybrid integration of heterogeneous field effect devices for integrated circuits, and more specifically, to 3-D hybrid integration of graphene field-effect transistors and silicon based devices.

DESCRIPTION OF RELATED ART

Graphene field effect transistor (FET) devices include a layer of graphene material that results in a device having high charge carrier mobility. These devices exhibit promise in high-frequency, e.g. radio-frequency, electronic applications.

The performance properties of graphene devices suggest that such devices may be useful when used in integrated circuits.

BRIEF SUMMARY

According one embodiment of the present invention a three dimensional integrated circuit includes a silicon substrate, a first source region disposed on the substrate, a first drain region disposed on the substrate, a first gate stack portion disposed on the substrate, a first dielectric layer disposed on the first source region, the first drain region, the first gate stack portion, and the substrate, a second dielectric layer formed on the first dielectric layer, a second source region disposed on the second dielectric layer, a second drain region disposed on the second dielectric layer, and a second gate stack portion disposed on the second dielectric layer, the second gate stack portion including a graphene layer.

According another embodiment of the present invention a three dimensional integrated circuit includes a silicon substrate, a first source region disposed on the substrate, a first drain region disposed on the substrate, a first gate stack portion disposed on the substrate, a first dielectric layer disposed on the first source region, the first drain region, the first gate stack portion, and the substrate, a second dielectric layer formed on the first dielectric layer, a second source region disposed on the second dielectric layer, a second drain region disposed on the second dielectric layer, a second gate stack portion disposed on the second dielectric layer, the second gate stack portion including a graphene layer, and a first conductive interconnect electrically connecting the first source region, the first drain region, the first gate stack portion to the second source region, the second drain region, the second gate stack Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates the formation of a silicon FET device;
FIG. 3 illustrates the formation of a dielectric layer;
FIG. 4 illustrates the formation of interconnects;
FIG. 5 illustrates the formation of a graphene layer;
FIG. 6 illustrates the formation of source and drain regions;
FIG. 7 illustrates the formation of a dielectric layer; and
FIG. 8 illustrates the formation of a conductive gate material.

FIG. 10 illustrates the formation of a silicon FET device;
FIG. 11 illustrates the formation of a dielectric layer;
FIG. 12 illustrates the formation of interconnects;
FIG. 13 illustrates the formation of a dielectric layer;
FIG. 14 illustrates the formation of a graphene layer;
FIG. 15 illustrates the patterning of the graphene layer; and
FIG. 16 illustrates the formation of source and drain regions.

FIG. 18 illustrates the formation of a dielectric layer; and
FIG. 19 illustrates the formation of a gate stack.

DETAILED DESCRIPTION

Integrated circuits may be formed on a silicon wafer using a variety of complimentary metal oxide semiconductor (CMOS) fabrication methods that form silicon based FET devises. Recently, a number of methods have been developed for fabricating graphene FET devices. Forming both silicon FET devices and graphene devices on a wafer in an integrated circuit offers increased performance benefits.

Figure 1:
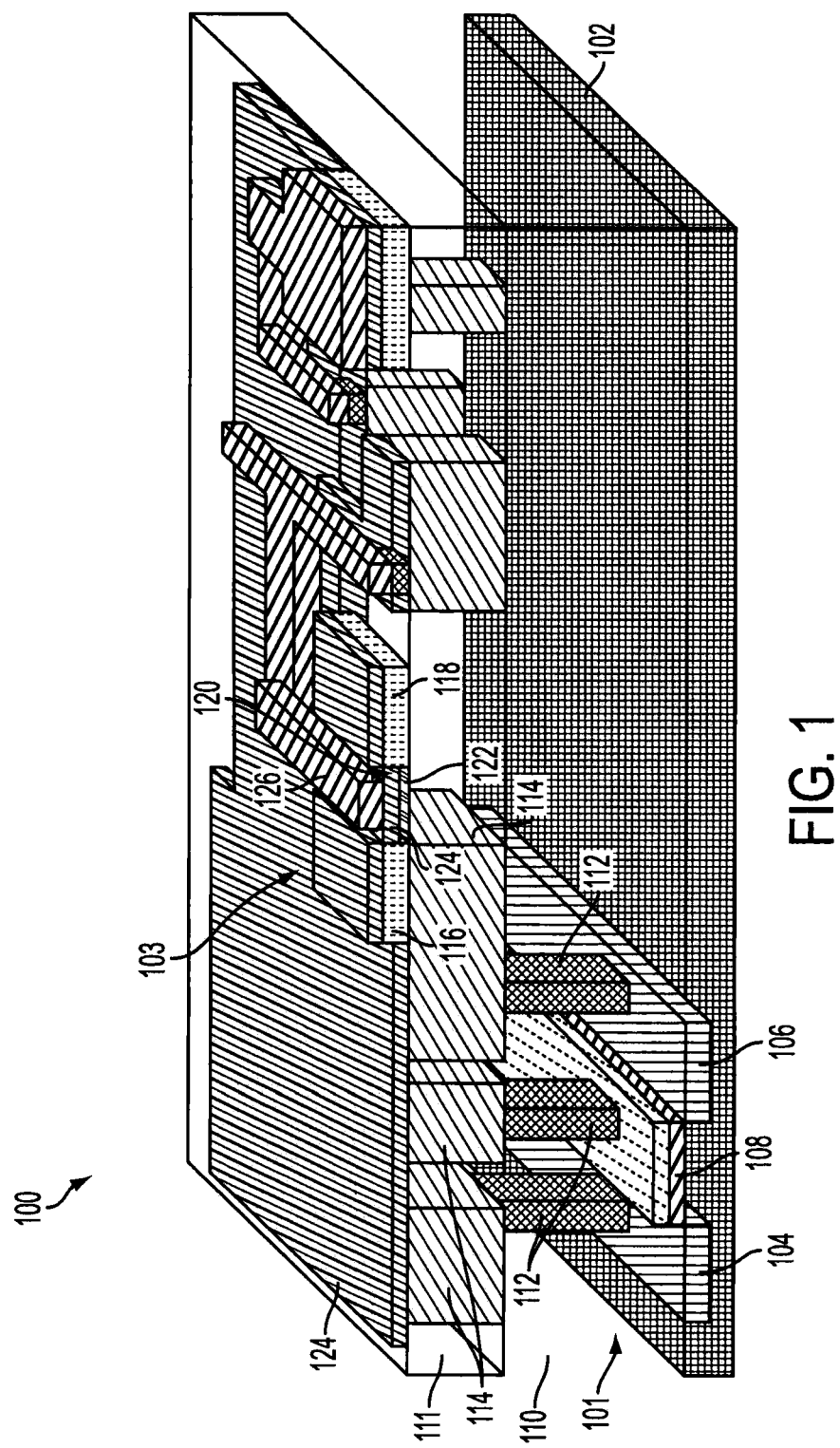
FIG. 1 illustrates an exemplary embodiment of a portion of a 3-D hybrid integrated circuit including a top-gated graphene FET.

FIG. 1 illustrates an exemplary embodiment of a portion of an integrated circuit 100 including a top-gated graphene FET device 103. The circuit portion 100 includes a silicon wafer substrate 102. A silicon FET device 101, such as, for example, a metal oxide semiconductor FET (MOSFET) or other type of silicon FET device, is disposed on the substrate 102. The device 101 includes a source region 104 and a drain region 106 that may include, for example, ion doped silicon material. A gate stack 108 is disposed between the source region 104 and the drain region 106. The gate stack 108 may include a metallic or polysilicon type gate material. A dielectric layer 110 is formed over the source region 104, the drain region 106, the gate stack 108 and the exposed substrate 102. Conductive vias 112 are formed in cavities in the dielectric layer 110 that are filled with a conductive material such as, for example, copper or tungsten. The vias 112 may connect the source region 104, the drain region 106, and the gate stack 108 to wide conductive interconnects 114 that are formed in a second dielectric layer 111. The conductive interconnects and inductors (interconnects) 114 are connected to a graphene FET device (graphene device) 103 that is disposed on the dielectric layer 111. In the illustrated embodiment, the graphene device 103 includes a conductive source region 116 and a conductive drain region 118, and a gate stack 120 that includes a graphene layer 122 disposed on the dielectric layer 111 and a dielectric layer 124 such as a high-K dielectric layer disposed on the graphene layer 122 between the source and drain regions 116 and 118. A conductive gate material 126 forms the gate stack 120.

Figure 2:
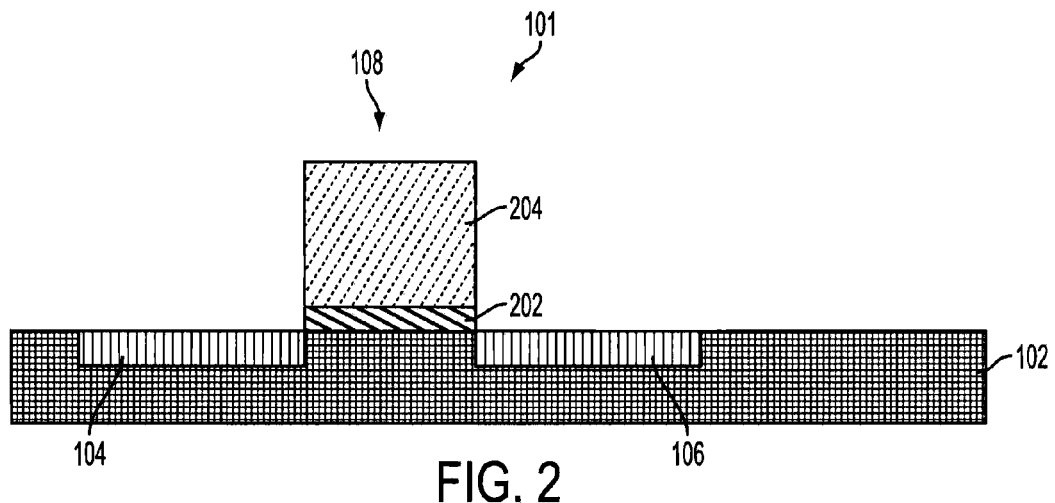
FIGS. 2-8 illustrate side views of an exemplary method for forming a circuit similar to the illustrated embodiment of FIG. 1, in this regard.

FIGS. 2-8 illustrate side views of an exemplary method for forming a device similar to the illustrated embodiment of FIG. 1 described above. Referring to FIG. 2, a silicon FET device 101 is fabricated by forming a source region 104 and drain region 106 in the substrate 102. The source and drain regions 104 and 106 may be formed by methods that include, for example, ion implantation or in-situ doping methods. The gate stack 108 is formed on a channel region of the substrate 102 partially defined by the source and drain regions 104 and 106. The gate stack 108 may include a variety of materials selected according to the specifications of the device 101. In the illustrated embodiment a CMOS device includes an oxide material layer 202 and a polysilicon material layer 204. Other embodiments of the device 101 may include, for example, a high-K/metallic gate or other type of FET gate stack structure.

Figure 3:
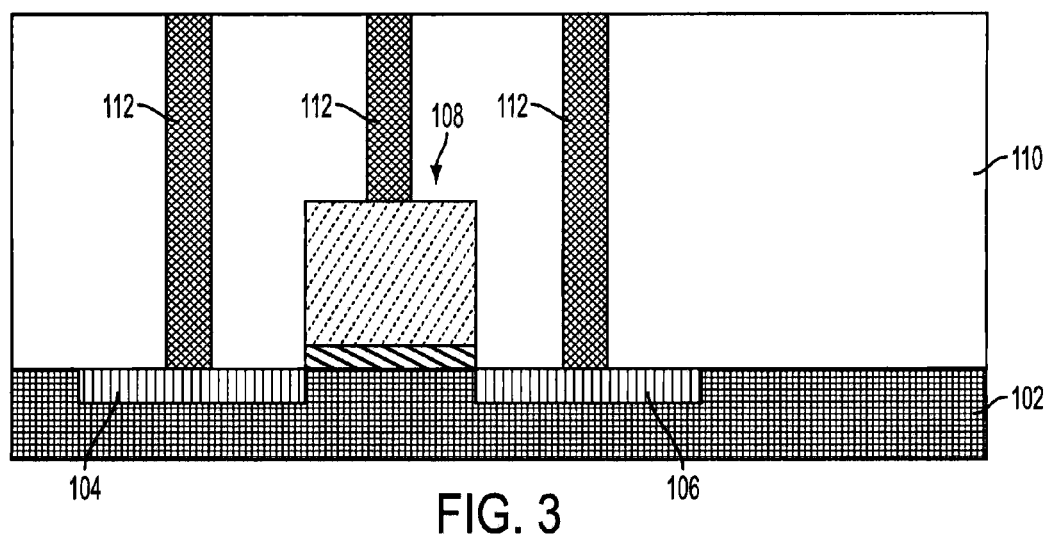

FIG. 3 illustrates the formation of a dielectric layer 110 over the device 101 and the exposed substrate 102 using for example, a chemical vapor deposition process. The dielectric layer 110 may include thick silicon oxide, for example. Once the dielectric layer 110 is formed, via cavities are formed in the dielectric layer 110 to expose portions of the source region 104, the drain region 106, and the gate stack 108. The via cavities are filled with a conductive material such as, for example, copper or tungsten resulting in the formation of the vias 112.

Figure 4:
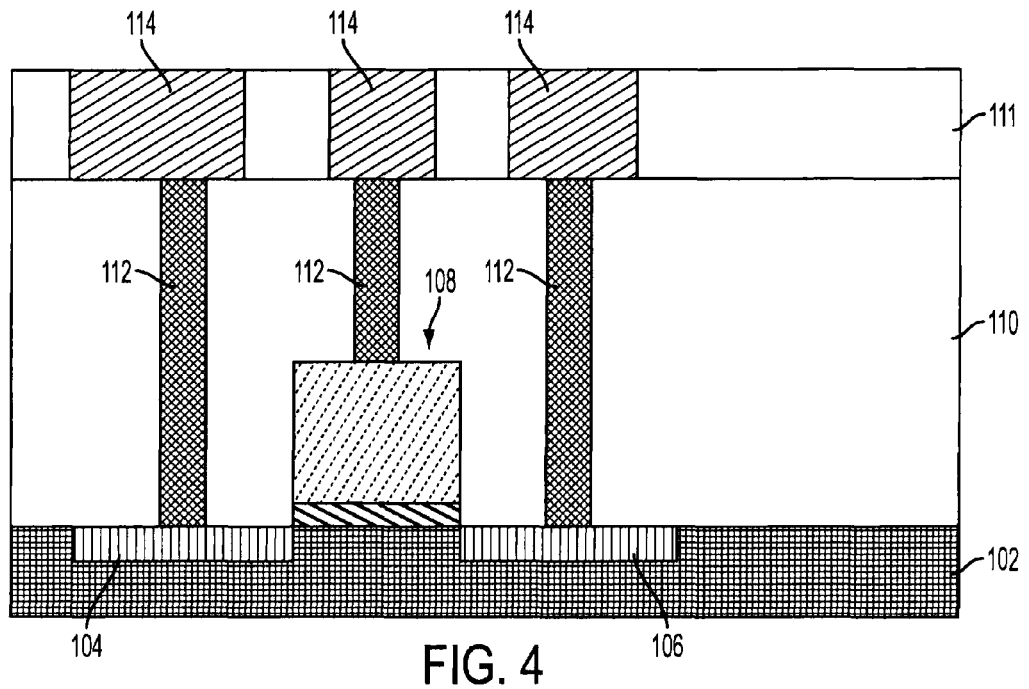

FIG. 4 illustrates the formation of wide conductive interconnects and inductors (interconnects) 114 that are electrically connected to the vias 112. The interconnects 114 may be formed from a metallic material such as, for example, copper or aluminum and are surrounded by the second dielectric layer 111.

Figure 5:
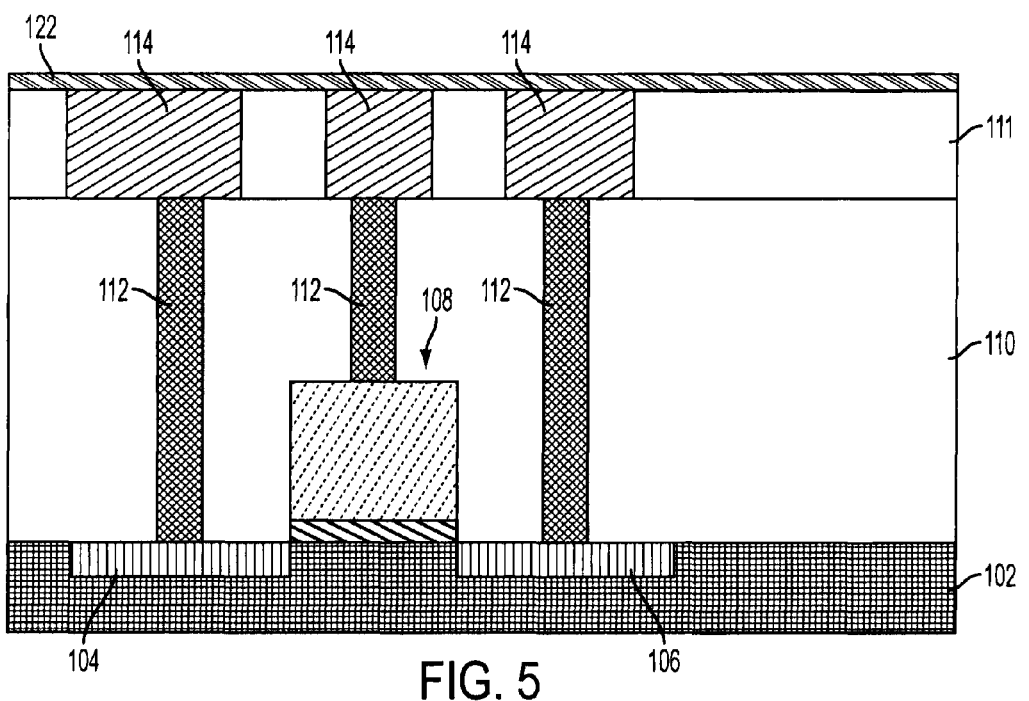

FIG. 5 illustrates the formation of second dielectric layer 111 over the dielectric layer 110 and a graphene layer 122 over the exposed interconnects 114 and portions of a second dielectric layer 111. The graphene layer 122 may be formed by any suitable method, for example, transferring the graphene material from a CVD grown graphene film on a copper foil or another graphene formation process.

Figure 6:
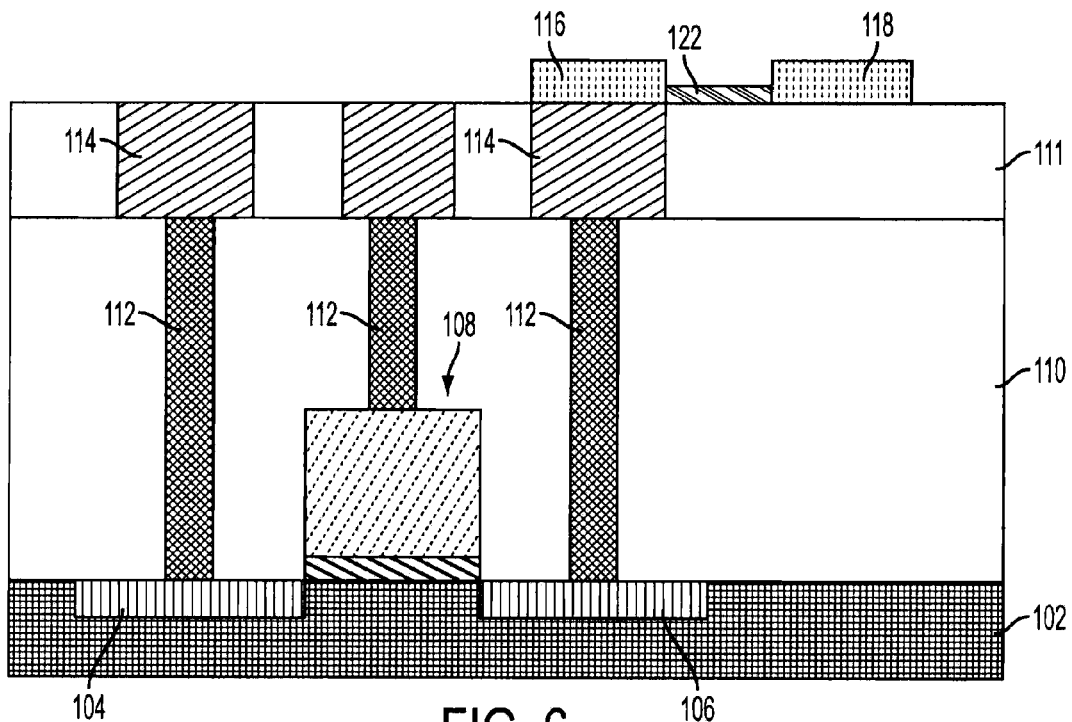

FIG. 6 illustrates the resultant structure following the patterning and etching of the graphene layer 122 using, for example an oxygen plasma process, or other suitable process that removes portions of the graphene layer 122 and defines the graphene layer 122 over the channel region of the device. Following the patterning of the graphene layer 122, a source region 116 and drain region 118 are formed onto the graphene layer 122. The source region 116 and the drain region 118 may electrically contact the corresponding interconnects 114. The source and drain regions 116 and 118 may be formed by, for example, photolithographic patterning and metallic material deposition processes.

Figure 7:
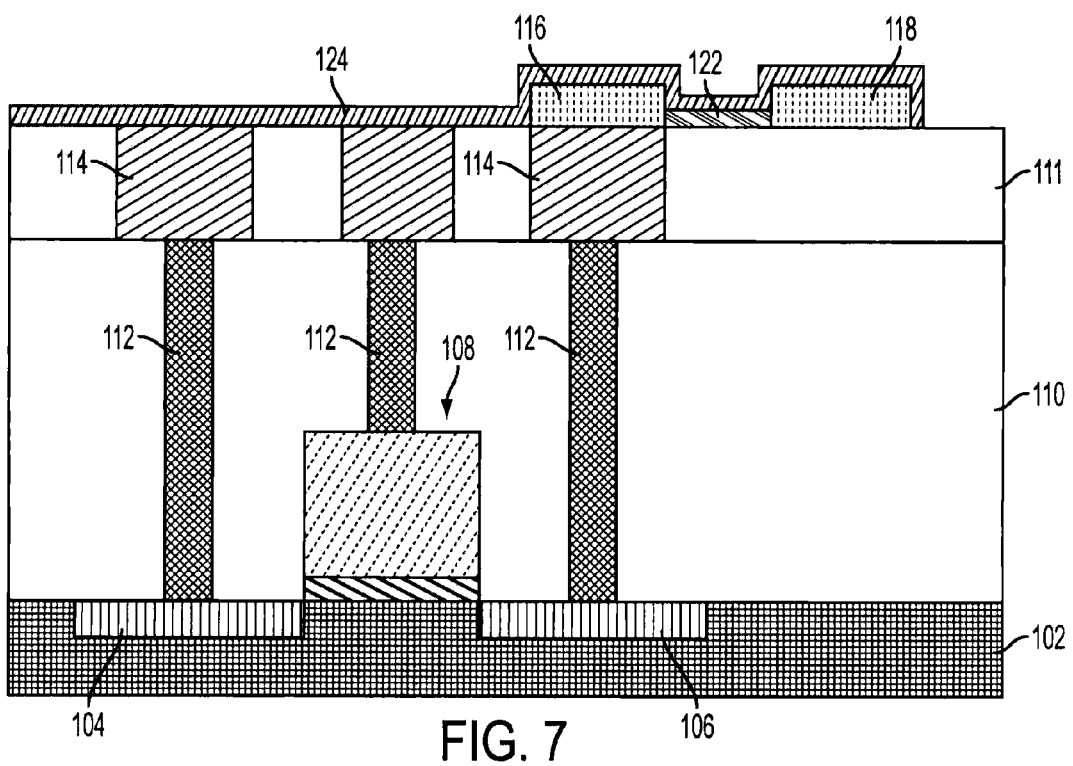

FIG. 7 illustrates the formation of a dielectric layer 124 that may include, for example, a high-K dielectric material. The dielectric layer 124 is formed over the exposed graphene layer 122 and the source and drain regions 116 and 118 using, for example, a chemical vapor deposition process or atomic layer deposition process.

Figure 8:
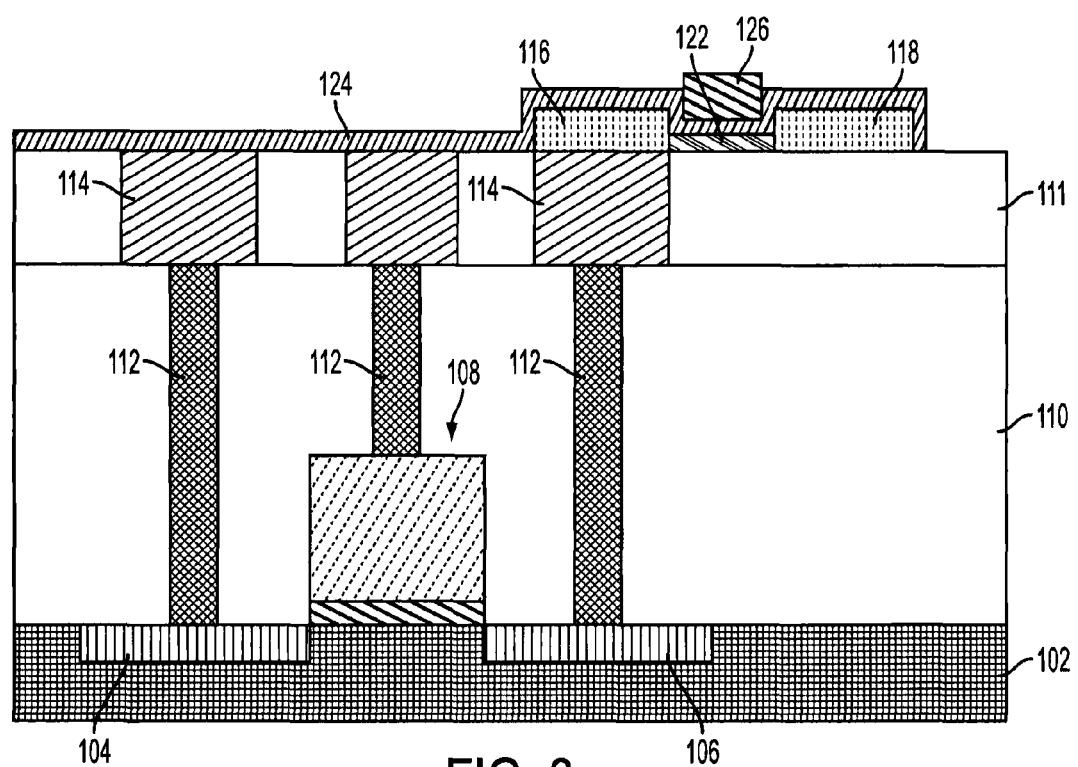

FIG. 8 illustrates the formation of a metallic gate material 126 that is patterned such that the metallic gate material 126 is formed over the dielectric layer 124 in the gate stack region 120 partially defined by the graphene layer 122 of the FET device 103.

Figure 9:
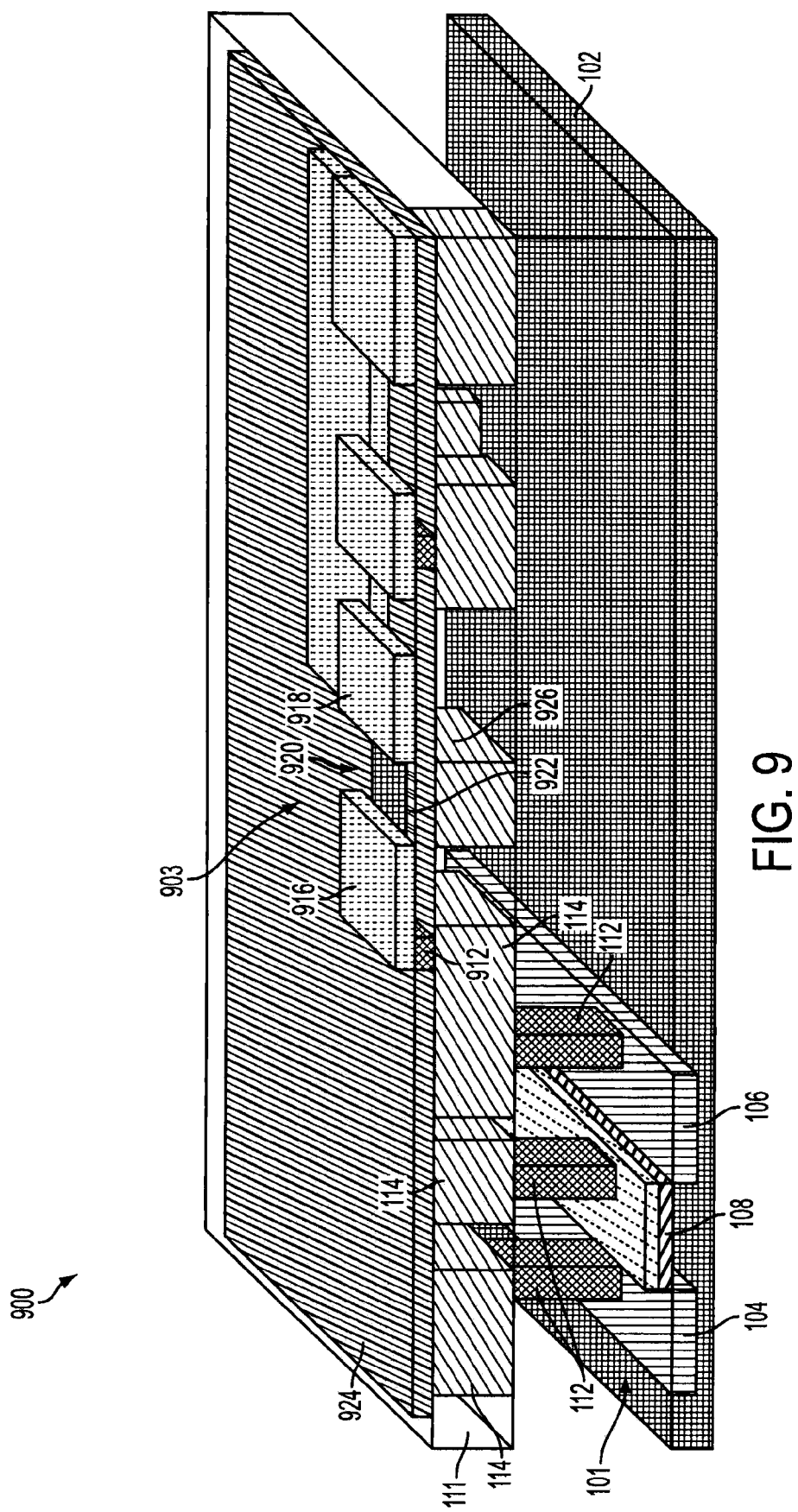
FIG. 9 illustrates an exemplary embodiment of a portion of an integrated circuit device including a bottom-gated graphene FET.

FIG. 9 illustrates an exemplary embodiment of a portion of an integrated circuit 900 including a bottom gated FET device 903. The circuit portion 900 includes a silicon wafer substrate 102. A silicon FET device 101, such as, for example, a metal oxide semiconductor FET (MOSFET) or other type of silicon FET device, is disposed on the substrate 102. The device 101 includes a source region 104 and a drain region 106 that may include, for example, ion doped silicon material. A gate stack 108 is disposed between the source region 104 and the drain region 106. The gate stack 108 may include a metallic or polysilicon type gate material. A dielectric layer 110 is formed over the source region 104, the drain region 106, the gate stack 108 and the exposed substrate 102. Conductive vias 112 are formed in cavities in the dielectric layer 110 that are filled with a conductive material such as, for example, copper or tungsten. The vias 112 may connect the source region 104, the drain region 106, and the gate stack 108 to conductive interconnects 114 that are formed in a second dielectric layer 111. The conductive interconnects and inductors (interconnects) 114 are connected to a graphene FET device (graphene device) 903 that is disposed on the dielectric layer 111. In the illustrated embodiment, the graphene device 903 includes a conductive source region 916 and a conductive drain region 918, and a gate stack 920 that includes a metallic gate material 926 formed in the dielectric layer 111, a dielectric layer 924 such as a high-K dielectric layer disposed on the metallic gate material 926 and the dielectric layer 111 and a graphene layer 922 formed on the dielectric layer 924. The source region 916 and the drain region 918 are electrically connected to the respective interconnects 114 with conductive vias 912 that pass through the dielectric layer 924.

Figure 10:
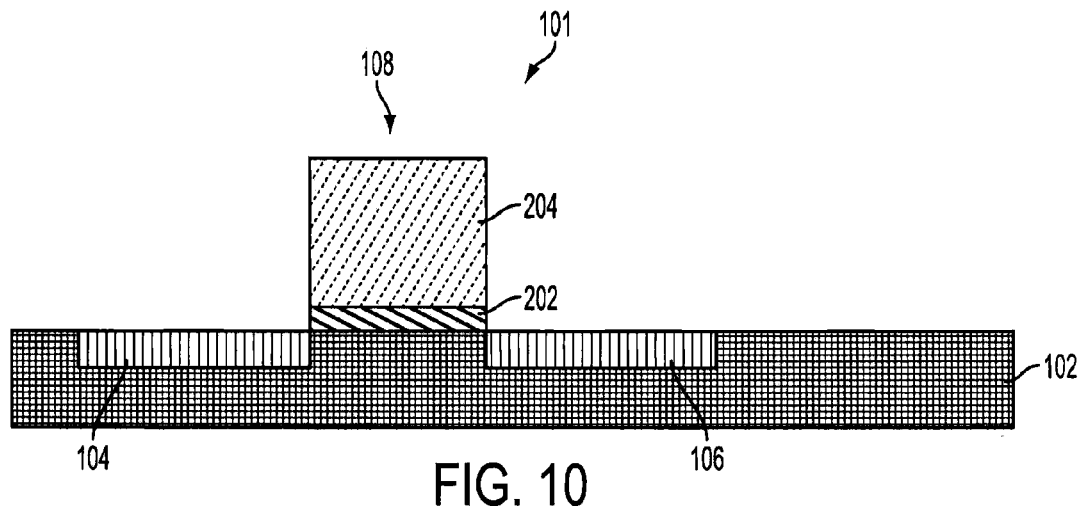
FIGS. 10-16 illustrate side views of an exemplary method for forming a circuit similar to the illustrated embodiment of FIG. 9, in this regard.

FIGS. 10-16 illustrate side views of an exemplary method for forming a device similar to the illustrated embodiment of FIG. 9 described above. Referring to FIG. 10, a silicon FET device 101 is fabricated by forming a source region 104 and drain region 106 in the substrate 102. The source and drain regions 104 and 106 may be formed by methods that include, for example, ion implantation or in-situ doping methods. The gate stack 108 is formed on a channel region of the substrate 102 partially defined by the source and drain regions 104 and 106. The gate stack 108 may include a variety of materials selected according to the specifications of the device 101. In the illustrated embodiment a CMOS device includes an oxide material layer 202 and a polysilicon material layer 204. Other embodiments of the device 101 may include, for example, a metallic gate or other type of FET gate stack structure.

Figure 11:
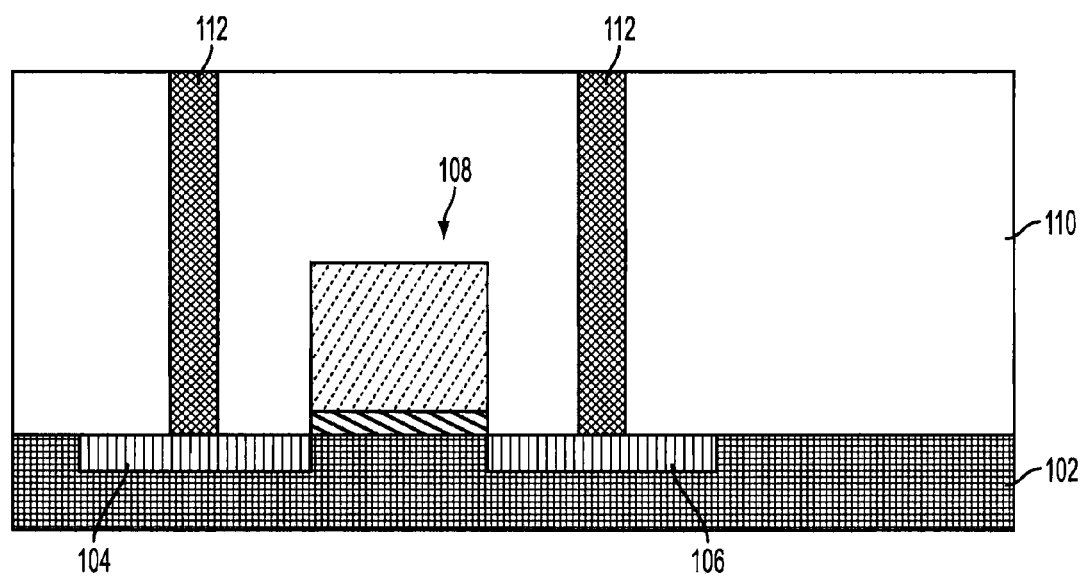

FIG. 11 illustrates the formation of a dielectric layer 110 over the device 101 and the exposed substrate 102 using for example, a chemical vapor deposition process. Once the dielectric layer 110 is formed, via cavities are formed in the dielectric layer 110 to expose portions of the source region 104, the drain region 106, and the gate stack 108. The via cavities are filled with a conductive material such as, for example, copper or aluminum resulting in the formation of the vias 112.

Figure 12:
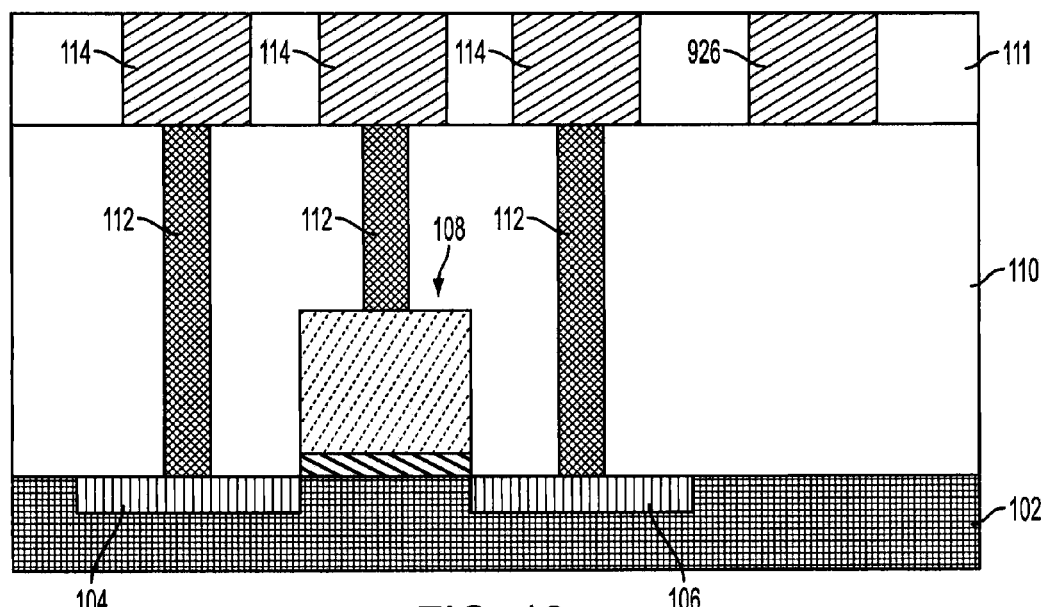

FIG. 12 illustrates the formation of a second dielectric layer 111 and conductive interconnects and inductors (interconnects) 114 that are electrically connected to the vias 112. The interconnects 114 may be formed from a metallic material such as, for example, copper or aluminum and are surrounded by the dielectric layer 111. A metallic gate material 926 is formed in the dielectric layer 111 using a similar method for forming the interconnects 114.

Figure 13:
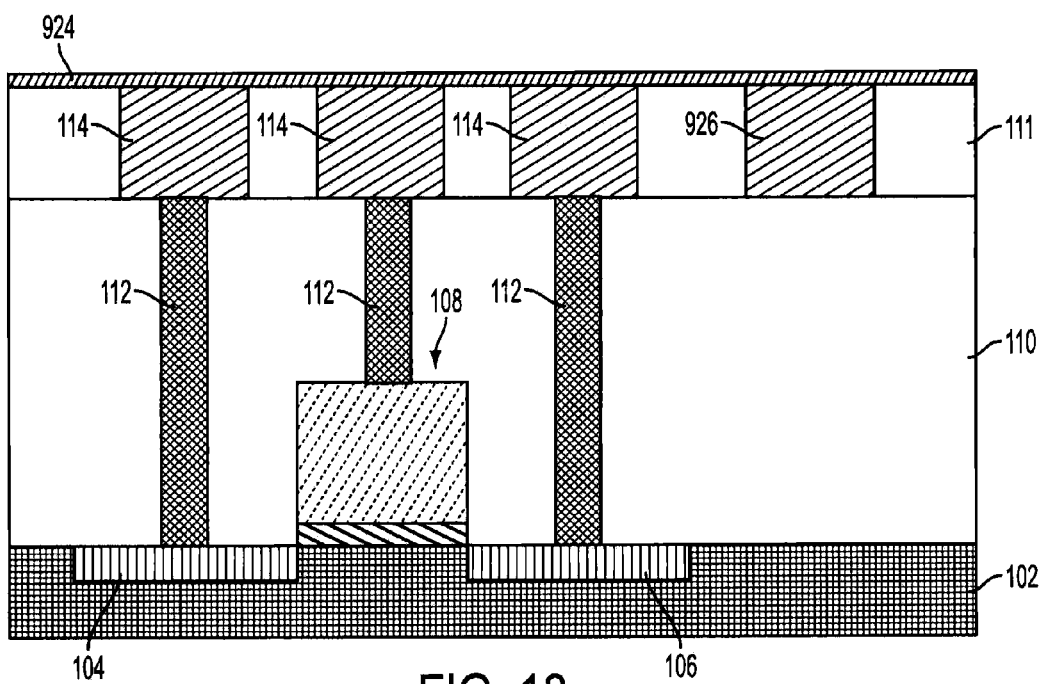

FIG. 13 illustrates the formation of a dielectric layer 924 such as, for example, a high-K layer over the exposed dielectric layer 111, the interconnects 114 and the metallic gate material 926.

Figure 14:
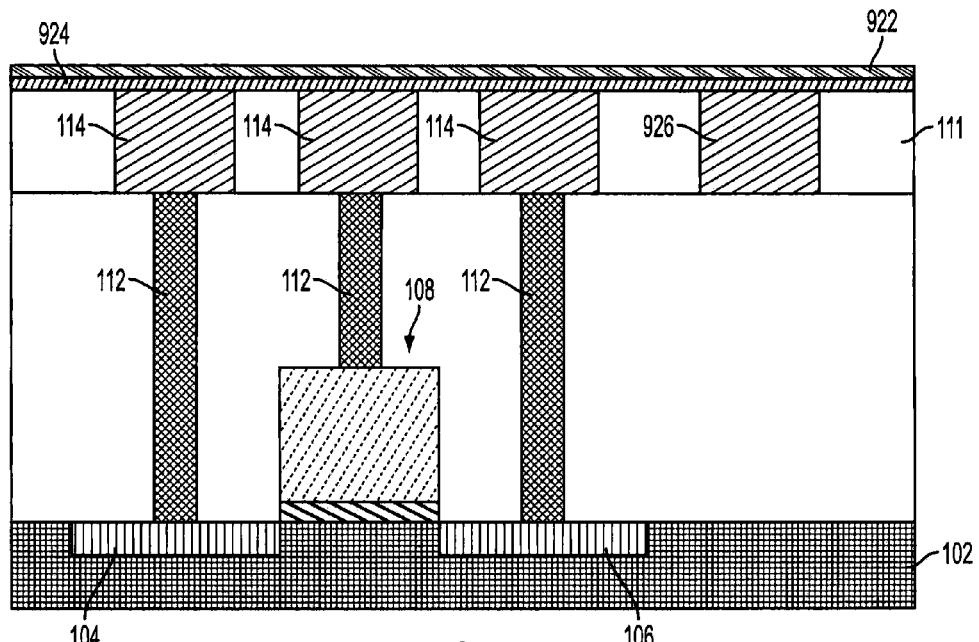

FIG. 14 illustrates the formation of a graphene layer 922 over the dielectric layer 924. The graphene layer 922 may be formed by any suitable method, for example, transferring the graphene material from a CVD grown graphene film on a copper foil or another graphene formation process.

Figure 15:
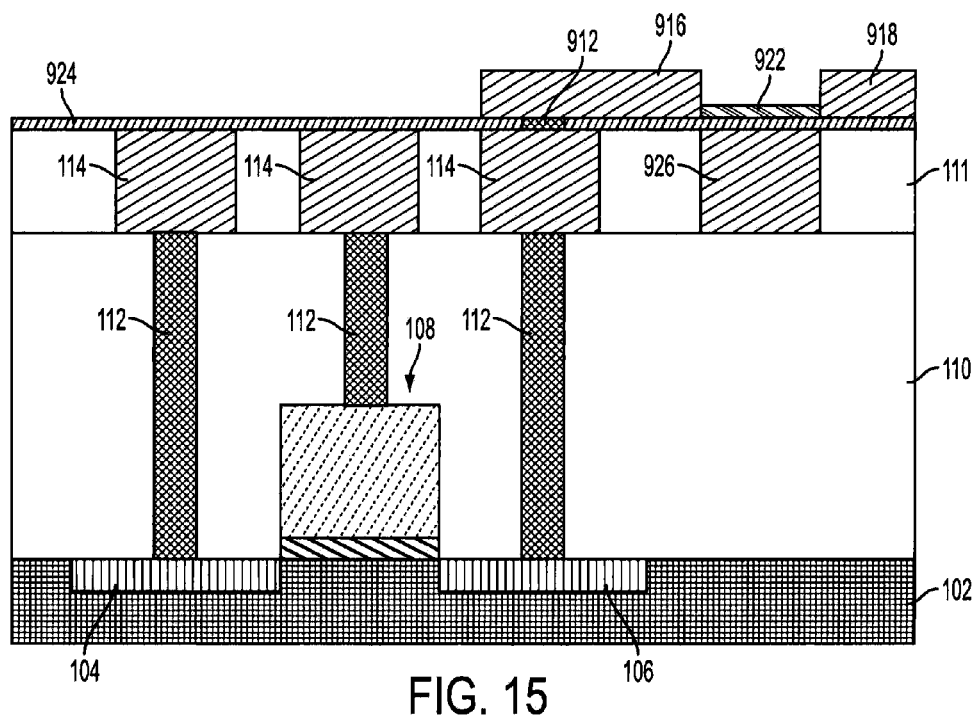

FIG. 15 illustrates the resultant structure following the formation of conductive vias 912 that pass through the dielectric layer 924 and contact the interconnects 114. The illustrated embodiment includes patterning and etching of the graphene layer 922 using, for example, an oxygen plasma process, or other suitable process that removes portions of the graphene layer 922 and defines the graphene layer 922 over the channel region of the device.

Figure 16:
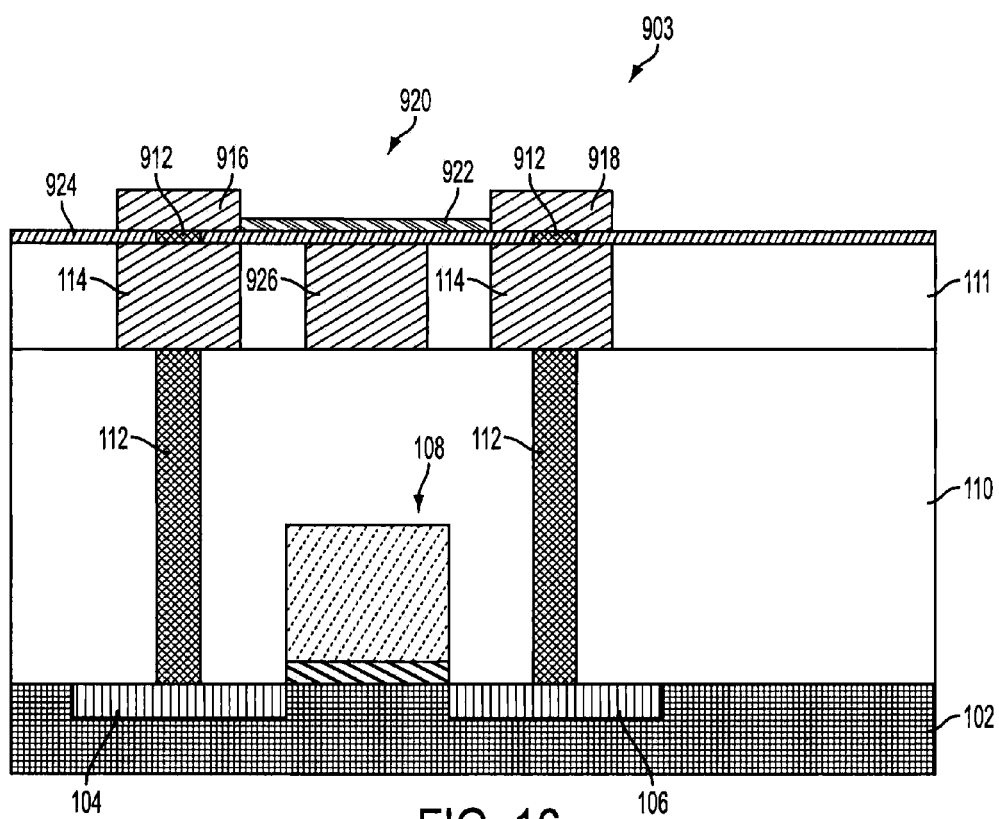

FIG. 16 illustrates the resultant structure following the formation of a source region 916 and drain region 918 that are formed proximate to the graphene layer 922. The source region 916 and the drain region 918 electrically contact the corresponding interconnects 114. The source and drain regions 916 and 918 may be formed by, for example, photolithographic patterning and metallic material deposition processes. The gate stack 920 of the resultant device 903 includes the metallic gate material 926, the dielectric layer 924, and the graphene layer 922.

Figure 17:
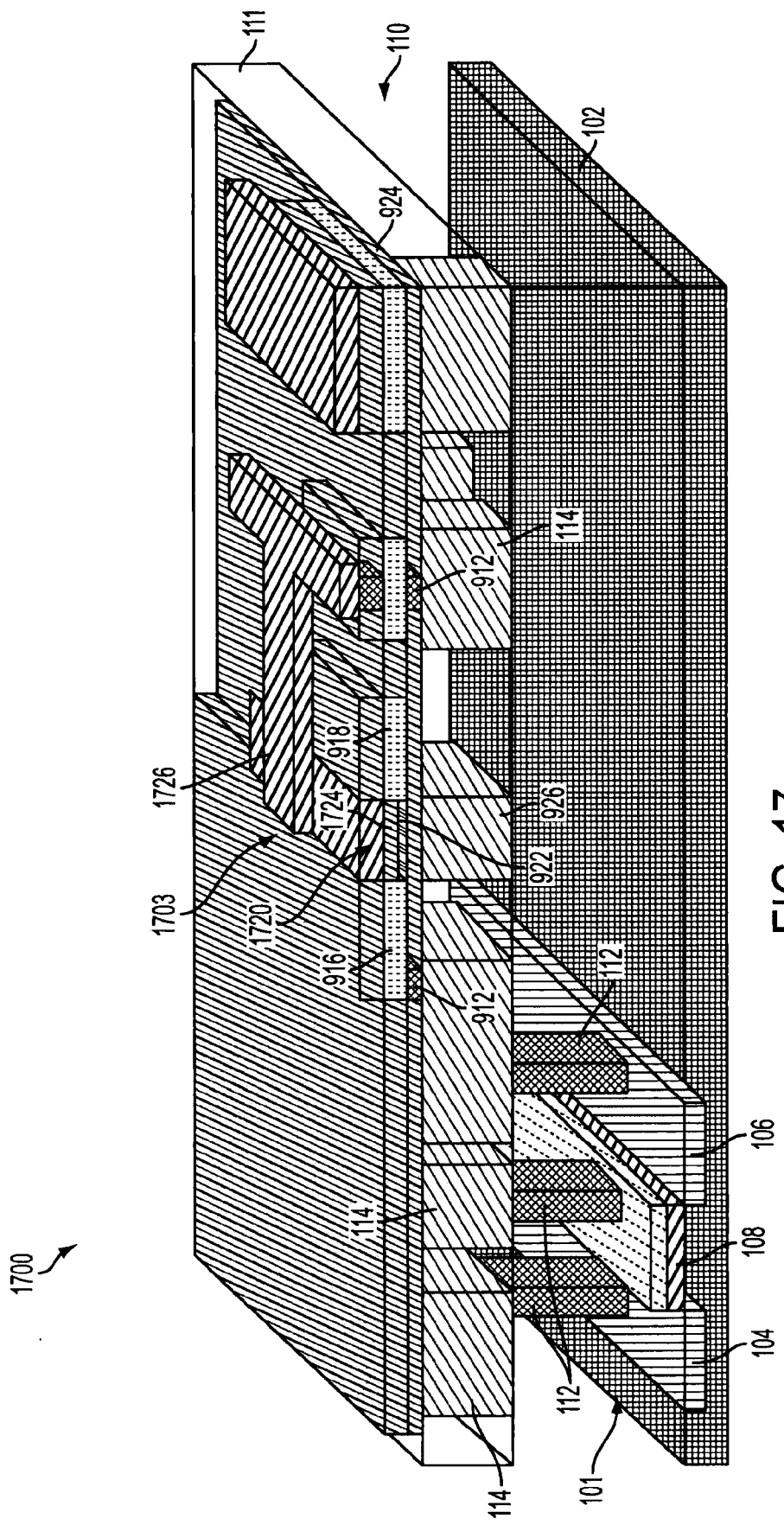
FIG. 17 illustrates an exemplary embodiment of a portion of an integrated circuit including a double-gated graphene FET.

FIG. 17 illustrates an exemplary embodiment of a portion of an integrated circuit device 1700 including a double gated FET device 1703. The device 1700 includes a silicon wafer substrate 102. A silicon FET device 101, such as, for example, a metal oxide semiconductor FET (MOSFET) or other type of silicon FET device, is disposed on the substrate 102. The device 101 includes a source region 104 and a drain region 106 that may include, for example, ion doped silicon material. A gate stack 108 is disposed between the source region 104 and the drain region 106. The gate stack 108 may include a metallic or polysilicon type gate material. A dielectric layer 110 is formed over the source region 104, the drain region 106, the gate stack 108 and the exposed substrate 102. Conductive vias 112 are formed in cavities in the dielectric layer 110 that are filled with a conductive material such as, for example, copper or tungsten. The vias 112 connect the source region 104, the drain region 106, and the gate stack 108 to conductive interconnects 114 that are formed in the dielectric layer 110. The conductive interconnects and inductors (interconnects) 114 are connected to a graphene FET device (graphene device) 1703 that is disposed on the dielectric layer 111. In the illustrated embodiment, the graphene device 1703 includes a conductive source region 916 and a conductive drain region 918, and a gate stack 1720 that includes a metallic gate material 926 formed in the dielectric layer 111, a dielectric layer 924 such as a high-K dielectric layer disposed on the metallic gate material 926, the dielectric layer 111 and a graphene layer 922 formed on the dielectric layer 924. The source region 916 and the drain region 918 are electrically connected to the respective interconnects 114 with conductive vias 912 that pass through the dielectric layer 924. A dielectric layer 1724 is formed over the exposed portions of the dielectric layer 924, the source and drain regions 916 and 918 and the graphene layer 922. A metallic gate material 1726 is formed over the dielectric layer 1724 in the gate stack region 1720 forming a double gate stack.

Figure 18:
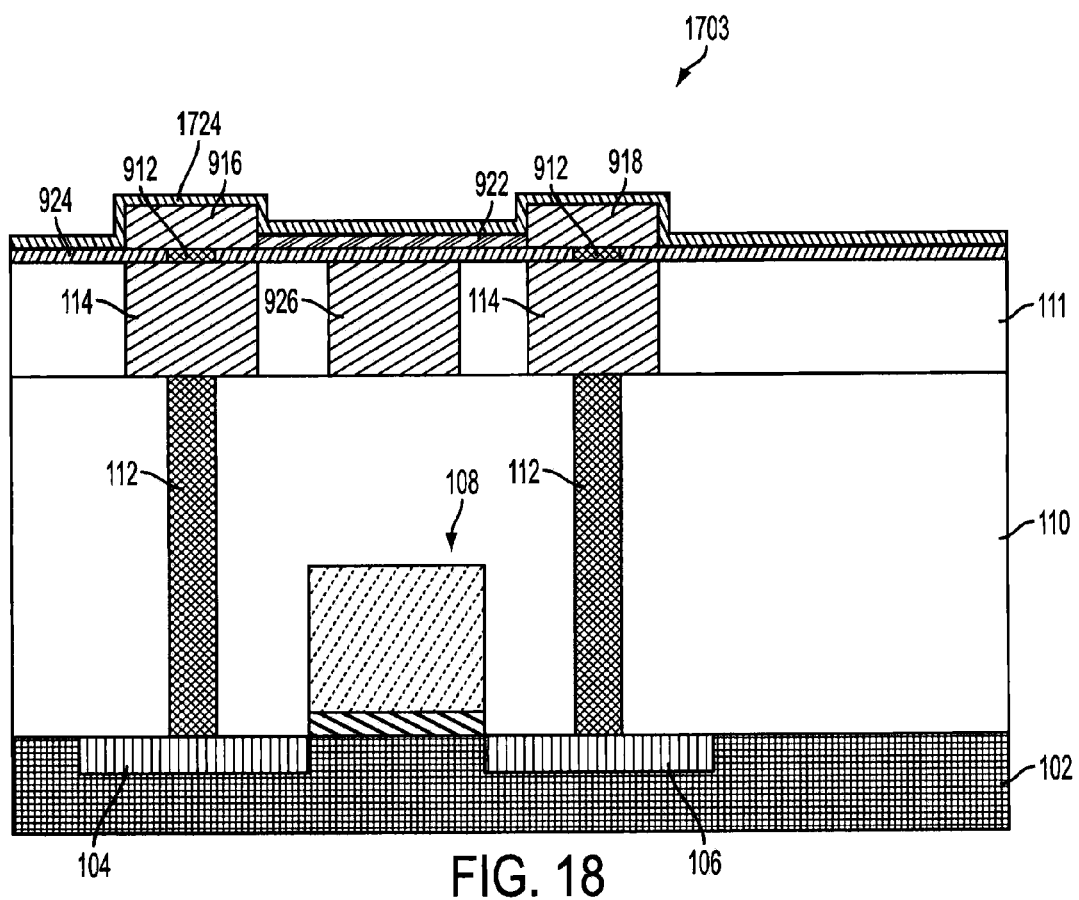
FIGS. 18-19 illustrate side views of an exemplary method for forming a circuit similar to the illustrated embodiment of FIG. 17, in this regard.
Figure 19:
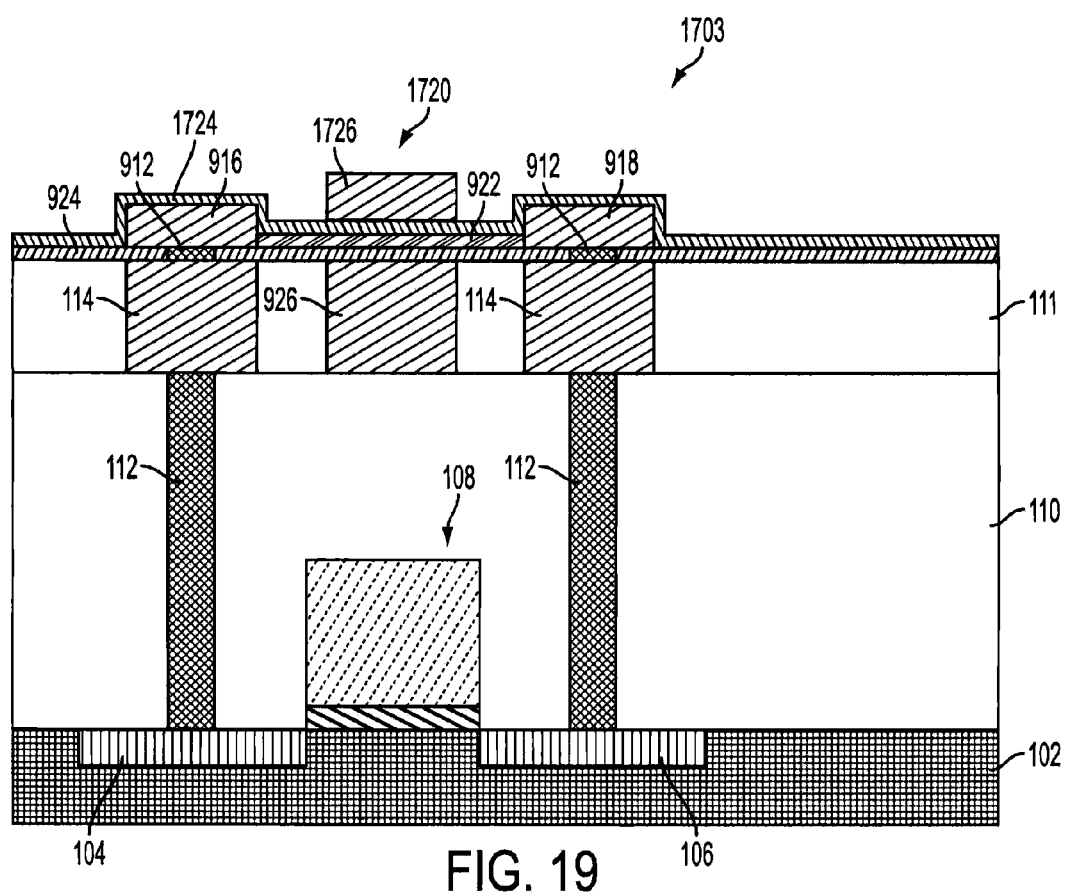

FIGS. 18 and 19 illustrate side views of an exemplary method for forming a device similar to the illustrated embodiment of FIG. 17 described above. In this regard the fabrication methods are similar to the methods described above in FIGS. 10 through 16. Referring to FIG. 17, following the formation of the source and drain regions 916 and 918, a dielectric layer 1724 such as, for example, a high-K layer is formed over the dielectric layer 924, the source and drain regions 916 and 918, and the graphene layer 922.

FIG. 19 illustrates the resultant structure following the formation of a metallic gate material 1726 on the dielectric layer 1724. The metallic gate material 1726 may be formed by, for example, a lithographic patterning and lift-off process.

Figure 20:
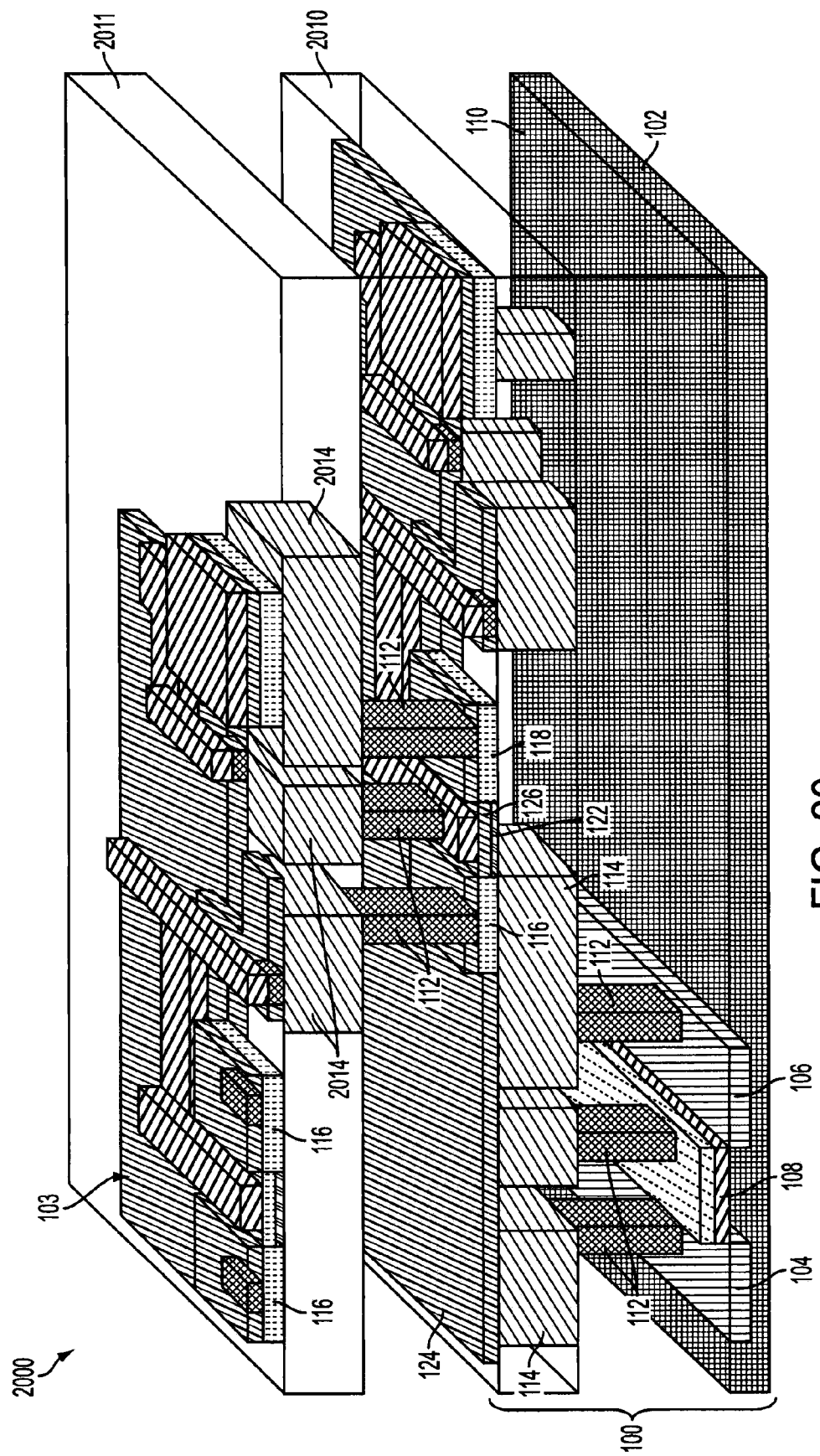
FIG. 20 illustrates an exemplary embodiment of a portion of a 3-D hybrid integrated circuit including multiple top-gated graphene FETs.

FIG. 20 illustrates an exemplary embodiment of a multi-layer circuit arrangement 2000. In this regard, the integrated circuit 100 including a top-gated graphene FET device 103 is formed in a similar manner as discussed above. Following the formation of the circuit 100, a dielectric layer 2010 is formed over the circuit 100. Connective vias 112 are formed in the dielectric layer 2010, and another dielectric layer 2011 is formed over the dielectric layer 2010. Conductive interconnects 2014 are formed in the dielectric layer 2011. A second top-gated graphene FET device 103 is formed on the dielectric layer 2011 in a similar manner as discussed above. The illustrated embodiment is but one example of a multilayer circuit arrangement. Alternative embodiments may include any type of arrangement of graphene devices and silicon devices.

The 3-D hybrid integrated circuit structure as described above can be further extended to multi-chip stacking by the Through-Silicon Via (TSV) methods.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A three dimensional integrated circuit including:
   a silicon substrate;
   a first source region disposed on the substrate;
   a first drain region disposed on the substrate;
   a first gate stack portion disposed on the substrate;
   a first dielectric layer disposed on the first source region, the first drain region, the first gate stack portion, and the substrate;
   a second dielectric layer formed on the first dielectric layer;
   a second source region disposed on the second dielectric layer;
   a second drain region disposed on the second dielectric layer; and
   a second gate stack portion disposed on the second dielectric layer, the second gate stack portion including:
      a graphene layer;
      a metallic gate material formed in the second dielectric layer;
      a third dielectric layer formed on the metallic gate material; and
      the graphene layer formed on the third dielectric layer.

2. The circuit of claim 1, wherein the circuit further includes:
   a first conductive interconnect electrically connecting the first source region, the first drain region, the first gate stack portion to the second source region, the second drain region, the second gate stack; and
   a second conductive interconnect electrically connecting the first source region, the first drain region, the first gate stack portion to the second source region, the second drain region, the second gate stack.

3. The circuit of claim 1, wherein the second gate stack portion includes:
   the graphene layer disposed on the second dielectric layer;
   a third dielectric layer; and
   a metallic gate material formed on the third dielectric layer.

4. The circuit of claim 1, wherein the second gate stack portion includes:
   a metallic gate material formed in the second dielectric layer;
   a third dielectric layer formed on the metallic gate material;
   the graphene layer formed on the third dielectric layer;
   a fourth dielectric layer formed on the graphene layer; and
   a second metallic gate material formed on the fourth dielectric layer.

5. The circuit of claim 1, wherein device includes:
   a fifth dielectric layer disposed on the fourth dielectric layer;
   a third source region disposed on the fifth dielectric layer;
   a third drain region disposed on the fifth dielectric layer; and
   a third gate stack portion disposed on the fifth dielectric layer, the third gate stack portion including a graphene layer.

6. The circuit of claim 1, wherein the first source region includes a metallic material.

7. The circuit of claim 1, wherein the first drain region includes a metallic material.

8. The circuit of claim 1, wherein the first source region includes a doped silicon material.

9. The circuit of claim 1, wherein the first drain region includes a doped silicon material.

10. The circuit of claim 1, wherein the circuit further includes a first conductive interconnect electrically connecting the first source region, the first drain region, the first gate stack portion to the second source region, the second drain region, the second gate stack.

11. The circuit of claim 1, wherein the circuit further includes a second conductive interconnect electrically connecting the first source region, the first drain region, the first gate stack portion to the second source region, the second drain region, the second gate stack.

12. A three dimensional integrated circuit including:
    a silicon substrate;
    a first source region disposed on the substrate;
    a first drain region disposed on the substrate;
    a first gate stack portion disposed on the substrate;
    a first dielectric layer disposed on the first source region, the first drain region, the first gate stack portion, and the substrate;
    a second dielectric layer formed on the first dielectric layer;
    a second source region disposed on the second dielectric layer;
    a second drain region disposed on the second dielectric layer;
    a second gate stack portion disposed on the second dielectric layer, the second gate stack portion including:
       a graphene layer;
       a metallic gate material formed in the second dielectric layer;
       a third dielectric layer formed on the metallic gate material;
       the graphene layer formed on the third dielectric layer; and
    a first conductive interconnect electrically connecting the first source region, the first drain region, the first gate stack portion to the second source region, the second drain region, the second gate stack.

13. The circuit of claim 12, wherein the circuit further includes a second conductive interconnect electrically connecting the first source region, the first drain region, the first gate stack portion to the second source region, the second drain region, the second gate stack.

14. The circuit of claim 12, wherein the second gate stack portion includes:
    the graphene layer disposed on the second dielectric layer;
    a third dielectric layer; and
    a metallic gate material formed on the third dielectric layer.

15. The circuit of claim 12, wherein the second gate stack portion includes:
    a metallic gate material formed in the second dielectric layer;
    a third dielectric layer formed on the metallic gate material;
    the graphene layer formed on the third dielectric layer;
    a fourth dielectric layer formed on the graphene layer; and
    a second metallic gate material formed on the fourth dielectric layer.

16. The circuit of claim 12, wherein device includes:
    a fifth dielectric layer disposed on the fourth dielectric layer;
    a third source region disposed on the fifth dielectric layer;
    a third drain region disposed on the fifth dielectric layer; and
    a third gate stack portion disposed on the fifth dielectric layer, the third gate stack portion including a graphene layer.

* * * * *